United States Patent
Cramer et al.

(10) Patent No.: US 6,930,438 B2
(45) Date of Patent: Aug. 16, 2005

(54) MULTILAYER ELECTRICAL COMPONENT HAVING A PASSIVATION LAYER

(75) Inventors: Dieter Cramer, München (DE); Carsten Schuh, Baldham (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/476,209

(22) PCT Filed: Apr. 18, 2002

(86) PCT No.: PCT/DE02/01444

§ 371 (c)(1),
(2), (4) Date: Mar. 22, 2004

(87) PCT Pub. No.: WO02/089225

PCT Pub. Date: Nov. 7, 2002

(65) Prior Publication Data

US 2004/0145276 A1 Jul. 29, 2004

(30) Foreign Application Priority Data

Apr. 30, 2001 (DE) .......................... 101 21 270

(51) Int. Cl.⁷ .......................................... H01L 41/083
(52) U.S. Cl. ...................................... 310/328
(58) Field of Search .............................. 310/328, 366

(56) References Cited

U.S. PATENT DOCUMENTS

| | | | |
|---|---|---|---|
| 2,879,496 A | * 3/1959 | Camp | 367/168 |
| 3,509,427 A | 4/1970 | Ruscetta | 361/519 |
| 4,011,474 A | 3/1977 | O'Neill | 310/369 |
| 4,377,652 A | 3/1983 | Ohmura et al. | 524/104 |
| 4,546,415 A | 10/1985 | Kent et al. | 361/433 |
| 4,987,518 A | 1/1991 | Dain | 361/517 |
| 5,218,259 A | 6/1993 | Dam et al. | 310/328 |
| 5,438,232 A | * 8/1995 | Inoue et al. | 310/328 |
| 5,902,320 A | * 5/1999 | Matsutani et al. | 606/222 |
| 6,186,619 B1 | * 2/2001 | Usui et al. | 347/72 |
| 6,236,146 B1 | 5/2001 | Cramer et al. | 310/366 |
| 6,310,764 B1 | 10/2001 | Will et al. | 361/513 |
| 6,563,687 B2 | * 5/2003 | Kawazoe et al. | 361/301.4 |
| 6,731,048 B2 | * 5/2004 | Kawazoe | 310/328 |
| 2003/0089879 A1 | 5/2003 | Ebel et a. | 252/62 |

FOREIGN PATENT DOCUMENTS

| | | | |
|---|---|---|---|
| DE | 1 925 508 | 11/1969 | H01G/9/00 |
| DE | 7 230 947 | 5/1973 | H01G/1/02 |
| DE | 25 44 140 | 4/1976 | H01L/41/10 |
| DE | 32 01 963 C2 | 8/1985 | H01G/1/02 |
| DE | 29 53 498 | 6/1989 | H01B/3/30 |
| DE | 196 46 676 C1 | 4/1998 | H01L/41/083 |
| DE | 198 18 036 A1 | 11/1999 | H01L/23/28 |
| DE | 199 10 111 A1 | 10/2000 | H01L/41/053 |
| DE | 199 29 598 A1 | 1/2001 | H01G/9/08 |
| DE | 100 16 866 C2 | 3/2002 | H01G/9/35 |
| EP | 0 575 889 A2 | 12/1993 | H01L/23/24 |
| GB | 1 383 498 | 2/1975 | C08G/69/26 |
| GB | 1525248 | 9/1978 | H02N/11/00 |
| JP | 10022177 A | 1/1998 | H01G/9/08 |

OTHER PUBLICATIONS

Zwanzigste et al., "Brockhaus Die Enzyklopadie", *Passionswerkzeuge–Passo Fundo*, pp. 624 (1996).

* cited by examiner

Primary Examiner—Thomas M. Dougherty
(74) Attorney, Agent, or Firm—Fish & Richardson P.C.

(57) ABSTRACT

A piezoelectric component has a multilayer structure. The piezoelectric component includes piezoelectric ceramic layers, electrode layers arranged among the ceramic layers in a stack such that the electrode layers and the piezoelectric ceramic layers alternate in the stack, and a passivation layer disposed on a lateral surface of the stack. The passivation layer is made from a passivation material that has a crack resistance that is lower than a bond strength of the passivation material.

25 Claims, 1 Drawing Sheet

MULTILAYER ELECTRICAL COMPONENT HAVING A PASSIVATION LAYER

BACKGROUND

The present invention relates, first, to a passivation material for an electric component according to the preamble of claim 1 and to a piezoelectric component in multilayer construction according to the preamble of claim 11.

Piezoelectric components can, for example, take the form of piezoelectric actuators as multilayer elements with a number of alternately arranged piezoelectric ceramic layers and electrode layers; these are becoming increasingly important in modern electrical engineering. For example, piezoelectric actuators are used as servomechanisms in combination with valves and the like.

A known piezoelectric actuator is, for example, described in detail in DE 196 46 676 C1. In such piezoelectric ceramics, the effect that is put to use is their tendency to develop a charge under mechanical pressure or tension and, conversely, to expand along the main axis of the ceramic layer with the application of an electrical voltage. In order to multiply the useful length elongation, for example, monolithic multilayer actuators are used, consisting of a sintered stack of thin piezoceramic foils (for example, lead zirconate titanate) with inserted metal electrode layers. The electrode layers alternately extend out of the stack and are electrically connected in parallel via external metallization. A striated or tape-like continuous external metallization is applied to both contact sides of the stack, which is connected to all electrode layers having the same polarity.

Between the external metallization and the electrical connections of the piezoelectric actuator, a transfer contact available in a wide variety of forms, for example a Cu-backed Kapton foil strip or similar, is frequently applied. If one applies an electrical voltage to the external contacts, the piezoelectric foils expand in the direction of the field. As a result of the mechanical series connection of the individual piezoelectric foils, the nominal expansion of the entire stack is already achieved at relatively low electrical voltages.

To achieve an optimum deflection of the piezoceramic multilayer actuator with minimum space requirement, the electrode layers must comprise the entire cross section of the actuator, up to, for example, an inactive bonding area. That means that the electrode layers of alternating polarity will be exposed on the lateral surfaces of the multilayer ceramic.

For this reason it is necessary to provide these bare electrode layers with a suitable passivation. In general, a passivation is a type of protective layer, insulation layer or the like used to avoid electric arcing and short circuits between adjacent electrode layers. Without a passivation, such arcing and short circuits could be created, for example, due to mechanical damage to the surface or contamination with dirt (e.g., sanding dust, fingerprints and the like), moisture (e.g., Ag migration or the like), or fuels (for example, diesel fuel, methyl ester of rape seed and similar). Such damage and/or contamination can, in particular, be caused when operating the actuator but also during the manufacturing process.

Passivations are currently manufactured by brushing on a passivation material, which is in the form of a self-adhesive silicone compound, onto the multilayer ceramic by hand after the exterior metallization. This silicone elastomer is then hardened in a drying chamber at 150° C. for about 30 minutes. Then the passivated actuators are sheathed in a cylindrical plastic casing using the same silicone elastomer.

The passivation material is selected using the following criteria: First, the passivation material must demonstrate a permanent temperature resistance of >150° C. This is due to the fact that piezoceramic multilayer actuators of the referenced type, for example, are used as actuators in a diesel generator that operates at a similarly high temperature. Also, the passivation material must self-adhere as much as possible to the multilayer ceramic. Finally, up until now it has been a requirement for passivation materials to demonstrate an elongation at break of >200% in order to be able to withstand elongations appearing at the poles during actuator operation.

However, passivation materials using self-adhesive silicone compounds, particularly in the operation of piezoelectric actuators in diesel injectors, have a serious disadvantage. For example, previously used silicone-base passivation materials have limited resistance against swelling when moistened with diesel fuel or methyl ester of rapeseed. Also, the passivation is liable to separate from its surface(s) during operation of the piezoelectric component.

SUMMARY

Starting from the referenced state of the art, the purpose of this invention is to specify a passivation material and a piezoelectric component in multilayer construction which can avoid the described disadvantages. In particular, a passivation material and a piezoelectric component will be provided which enables and/or demonstrates high dependability and durability, preferably also when used in diesel applications.

This task is solved by the passivation material according to claim 1 and the piezoelectric component according to claim 11. Additional advantages, features, details, aspects and effects of the invention are found in the subclaims, the specification and the drawing. It is self evident that features and details which are described in connection with the inventive passivation material also apply to the inventive piezoelectric component and vice-versa.

According to the first aspect of the invention, a passivation material is provided for an electrical component, in particular for a piezoelectric component in multilayer construction, which is characterized according to the invention in that the passivation material demonstrates a crack resistance which is lower than the bonding strength of the passivation material on the electrical component.

By using an inventive passivation material on an electrical component, components are created with high reliability and durability. Also, the invention is not limited to specific types of electrical components. Rather, the passivation material can be used for every type of electrical component that requires corresponding passivation. Advantageously, the passivation material according to the invention can, however, be used for a piezoelectric component in multilayer construction, for example, a piezoceramic actuator in multilayer construction referenced in the introduction to the specification.

If the passivation materials previously known from the state of the art required materials with high elasticity, it has now been shown, surprisingly, that materials can be used advantageously as passivation materials whose crack resistance is lower than the bonding strength of the material on the electrical component.

In this context, crack resistance is understood to mean (tensile) stress at the moment of the crack. Bonding strength is understood to mean the stress at which the bond between the passivation material and the electrical component is interrupted. Therefore, for example, bonding strength is the stress at which the passivation material separates from the electrical component.

The present invention is based, among other things, on the fundamental idea that polarity- and operating-related mechanical damage of the electrical component, in particular a piezoelectric component in multilayer construction, primarily begins in the piezoelectrically inactive bonding area. Here there can be delamination cracks at the interface to the interior electrode of the electrodes that extend to the surface of the component—and in the material supporting the electrode, for example, a ceramic layer. Normally, there is no connection between two electrode layers of different polarity as the crack progresses. Accordingly, even in the presence of moisture and the like in the crack there are no arcing or short circuits between electrode layers of different polarity inside the electrical component.

Crucial for the reliability of electrical components, in particular piezoelectric components in multilayer construction, is conversely that the adhesion of the passivation material on the surface of the electrical component in the area of the crack remains unaffected. If the passivation material does not crack in the area of a delamination crack, for example the ceramic layer, each deflection of the piezoelectric component, and therefore the opening of the crack sides, will produce substantial tensile and shearing stresses to the electrical component—passivation material interface surrounding the crack. This can lead to successive separation of the passivation material in this area. If, then, moisture or the like penetrates into the gap between the surface of the electrical component and the passivation material, the rapid failure of the electrical component can be anticipated due to an electrical short circuit along the surface of the electrical component between two adjacent electrode layers of opposite polarity.

These disadvantages are avoided by using the passivation material according to the invention. Before separation of the passivation material from the surface of the piezoelectric component occurs due to the circumstances described above, a crack develops in the passivation material. Such a crack—in particular perpendicular to the surface of the passivation material—reduces the tensile and shearing stresses to the electrical component in the plane of the passivation material, for example a passivation layer, caused by the operating elongation of the sheathed electrical component. The result is that the passivation material does not separate from the surface of the electrical component. Crack resistance and bonding strength are also advantageous in terms of the mechanical stress levels in the plane of the passivation material, for example a passivation layer.

Due to the design of the passivation material according to the invention a much larger number of potential passivation materials are now available because, in particular, more highly cross-linked systems with lower deformability can be included.

The passivation material can be advantageously produced from at least one plastic.

Also, any polymer which demonstrates the inventive material properties is a suitable plastic. Therefore, in particular, polymers can also be used which can be fabricated using alternate coating processes, such as plasma deposition, corona deposition, sputtering, flame CVD and the like.

The plastic can be, for example a thermoplastic distinguished by the fact that it can assume a thermoplastic state under certain conditions.

For example, the at least one plastic can exist in the form of a more highly cross-linked plastic.

Preferably, the passivation material can be formed from at least one material, which during processing exhibits low-viscosity properties. In general, low-viscosity materials are those displaying low viscosity during processing, whereby, in general, viscosity is understood to be a standard of the flow resistance or internal friction of a material, in particular a material in fluid or semi-fluid form.

The use of such a material is therefore particularly advantageous because to sheath or coat the electrical component with a suitable passivation material is a highly complex process, therefore requiring a very painstaking manufacturing process. The application of the passivation material onto the piezoelectric component can, for example, be accomplished using an injection molding process or the like.

The passivation material can be advantageously made of at least one polyurethane. The polyurethane is preferably liquid polyurethane. Higher cross-linked formulations can be used advantageously as suitable polyurethanes.

In particular, liquid polyurethanes have the advantage of exhibiting very low viscosity during processing.

Polyurethanes have the additional advantage of permitting expansions of up to 200 percent at low temperatures. This is especially advantageous if the polyurethane is used as a passivating material for a piezoelectric component in multilayer construction, for example, an actuator. When used, such a piezoelectric actuator undergoes substantial changes in length. These dynamic movements should also be made by the passivation material as well as possible. While at room temperature or even at elevated temperature these requirements are seldom critical, that is not the case for low temperatures of, for example, lower than −20° C., in particular, lower than −40° C. Polyurethanes have the advantage of having an elongation at break of over 200 percent even at temperatures of −40° C.

Polyurethanes have very good medium stability in water and diesel fuel. This feature will be described in greater detail in connection with the degree of swelling discussed below. Further, polyurethanes exhibit minor media permeation, very high dynamic stability and good bonding strength to a surface of the piezoelectric component, for example, to a ceramic surface. Finally, polyurethanes have a relatively low price compared to other materials.

Finally, polyurethanes exhibit very good thermal aging values at 150° C. As a rule, thermal aging leads to a softening of the material, which is reflected in a continuous decrease in hardness, for example Shore A hardness. Associated with the decreasing hardness of the samples is an increase in elongation at break, whereby development of the elongation at break to high values, which is positive, decreases with increasing storage time of the material. With increasing storage time, tensile strength shows a similar development as the elongation at break. After an initial increase in strength, there is a rapid drop, which, however, after long storage periods settles into a virtually constant level.

In another embodiment, the passivation material can be comprised of at least one fluorine-based material.

Here, the material can be preferably a fluoroplastic. These include, for example, PTFE (Teflon), PFA, FEP, ETFE and similar plastics. However, a fluorosilicone or a fluorine rubber can also be used as a suitable passivation material. Fluorine rubbers, in particular, exhibit good media resistance as well as good temperature resistance and low viscosity during processing. In particular, fluorine rubbers also exhibit good temperature resistance even at the lowest temperatures, for example at temperatures of −40° C.

Advantageously, the passivation can be made of at least one material on a fluorine-silicon-rubber basis. This is a material which is also available as a liquid system, that is as a material with low-viscosity properties during processing. Fluorine silicon rubbers also have very high temperature stability, also at low temperatures down to −40° C., and have an elongation at break of over 200 percent.

Fluorine silicon rubber has good media stability, in particular in the media of water, diesel fuel and methyl ester of rapeseed. This stability is indicated by the low degree of swelling even at high operating temperatures. The significance of degree of swelling will be explained in greater detail below.

In another embodiment, the passivation material can, for example, consist of at least one resin. Silicone resins, epoxide resins and similar are possible.

Preferably, the passivation material can also consist of at least one material from the group of the latexes. Suitable materials in this group include, for example, though not exclusively, acrylate latex. Such acrylate latex can be advantageously dispersed in water.

In another embodiment, the passivation material can consist of at least one material from the group of polyimides and/or polyamides and/or polymethylacrylates and/or parylenes. The polyimide can be, for example, Kapton. Parylene can, for example, be produced by vapor phase deposition.

The passivation material can advantageously consist of one of the materials described above or from a number of materials in any combination. The only important thing is for the passivation material to have a crack resistance that is lower than its bonding strength on the electrical component.

Advantageously, the passivating material can have a degree of swelling in fluid media of ≦40 percent. The swell value is a change in volume in percent measured over a given time period.

If the piezoelectric component which is provided with a passivation material consists of, for example, a piezoelectric actuator, which is provided as a drive unit in a diesel generator, the material sheathing the actuator, for example the passivation material covering the surface of the actuator, must be resistant against the surrounding media, for example, water, diesel fuel, methyl ester of rape seed, or similar. That applies in particular to operating temperatures up to 150° C., which are possible peak loads for a diesel engine. As the passivation material also serves to protect the piezoelectric actuator, it must exhibit a certain degree of leak tightness to these media. As a measure for the barrier properties, the swelling and/or degree of swelling of the materials in the corresponding media is used under the assumption that a low degree of swelling is synonymous with a high degree of leak tightness.

Determining the degree of swelling can be performed, for example, by placing a sample of the passivation material for a certain time at a certain temperature in a medium, whereby the swelling is measured after the end of the test period, where the volume of the sample is measured at the beginning and at the end of the swelling test.

In a series of tests, different passivation materials were place for a period of 96 hours, for example in water, diesel fuel and rapeseed methyl ester. The purpose was to find passivation materials that exhibited a degree of swelling of ≦40 percent, preferably ≦20 percent, and quite preferably ≦10 percent.

In swelling tests in water at 100° C., it was shown that polyurethane and fluorine silicon rubber were especially suited as passivation materials, with degree of swelling of lower than 5% by volume.

A test for swelling of passivation materials in diesel fuel was conducted at temperatures of 140° C. Here, as well, fluorine silicon rubbers and polyurethane were shown to be advantageous materials.

The swelling test in methyl ester of rapeseed was also conducted at 140° C. Here, too, fluorine silicon rubber and polyurethane were shown to be advantageous passivation materials. Both materials revealed only moderately pronounced degrees of swelling of less than/equal to 40 percent after being immersed for 96 hours.

Advantageously, the passivation material exhibits a temperature stability of >150° C.

The inventive passivation material described above exhibits a large number of advantages compared to the state of the art of known, previously used passivation materials that were required to meet a demand for high elasticity. For example, the passivation materials according to the invention demonstrate substantially higher swelling stability, in particular in diesel fuel and methyl ester of rapeseed. Further, the inventive passivation materials reveal high bonding strength on the electrical component, which is the case with or without the use of adhesives such as bonding agents and similar. Also, the passivation materials demonstrate preferably low-viscosity properties during processing, which in particular makes it easier to manufacture and apply them to the electrical component, for example using a molding process or similar. Further, the passivation materials according to the invention exhibit cross-linking and/or hardening behavior that can be optimized by process engineering. The inventive passivation materials can now also be applied to the electrical components using alternate coating processes, such as immersing, spraying, CVD (chemical vapor deposition) and the like. In addition, the passivation materials demonstrate a distinctly lower permeability to steam and other gases as well as a significantly higher electric insulation and dielectric strength. Finally, use of the inventive passivation materials on the electrical component results in a significant improvement in its functionality and to a simplification of process engineering implementation.

According to a second aspect, a piezoelectric component in multilayer construction is provided in which one piezoelectric ceramic layer and one electrode layer are always provided on top of one another, whereby each electrode layer at least in part extends up to at least one lateral surface of the stack, and in which at least one lateral surface is provided with a passivation. The piezoelectric component is characterized according to the invention in that the passivation comprises an inventive passivation material as described above.

By designing the passivation using a passivation material according to the invention, it is now possible to provide reliable piezoelectric components with high durability, in which the bonding of the passivation to the surface of the stack remains unaffected at all times, especially also after the formation of cracks in the ceramic layer(s). The reason for that is, for example, the lower crack resistance of the passivation material compared to its bonding strength. In order to avoid repetition, reference is made to the above embodiments of the inventive passivation material in full with regard to the advantages, effects and operation of the piezoelectric components.

Preferably, the passivation material can be applied to the lateral surface of the stack using at least one adhesive.

However, such an adhesive is not always necessary. If, for example, the passivation material consists of at least one polyurethane, the connection between the polyurethane after it is applied to the ceramic layers is so strong that no additional adhesives are required. If such a strong connection is, however, not possible, the corresponding bonding strength can be created by using suitable adhesives.

The invention is not limited to certain types of adhesives. For example, though not exclusively, suitable bonding agents can be used to create the corresponding bonding strength. In any case, the selection of suitable bonding agents depends on the type of passivation material used and the material of the piezoelectric component on which the passivation material is to be applied.

Advantageously, the piezoelectric component can take the form of a piezoelectric actuator or as a piezoelectric transducer. Advantageous embodiments for actuators are, for example, stack actuators, transverse actuators, bending actuators or the like.

In an especially advantageous embodiment, the piezoelectric component can be used as a piezoelectric actuator in a diesel generator. By using the inventive passivation material on the surface or surfaces of the piezoelectric components, among other things a diesel-proof and dependable passivation of the piezoelectric actuator can be achieved.

The invention will now be described in greater detail using an embodiment and a drawing of the same embodiment.

DETAILED DESCRIPTION

Figure 1:
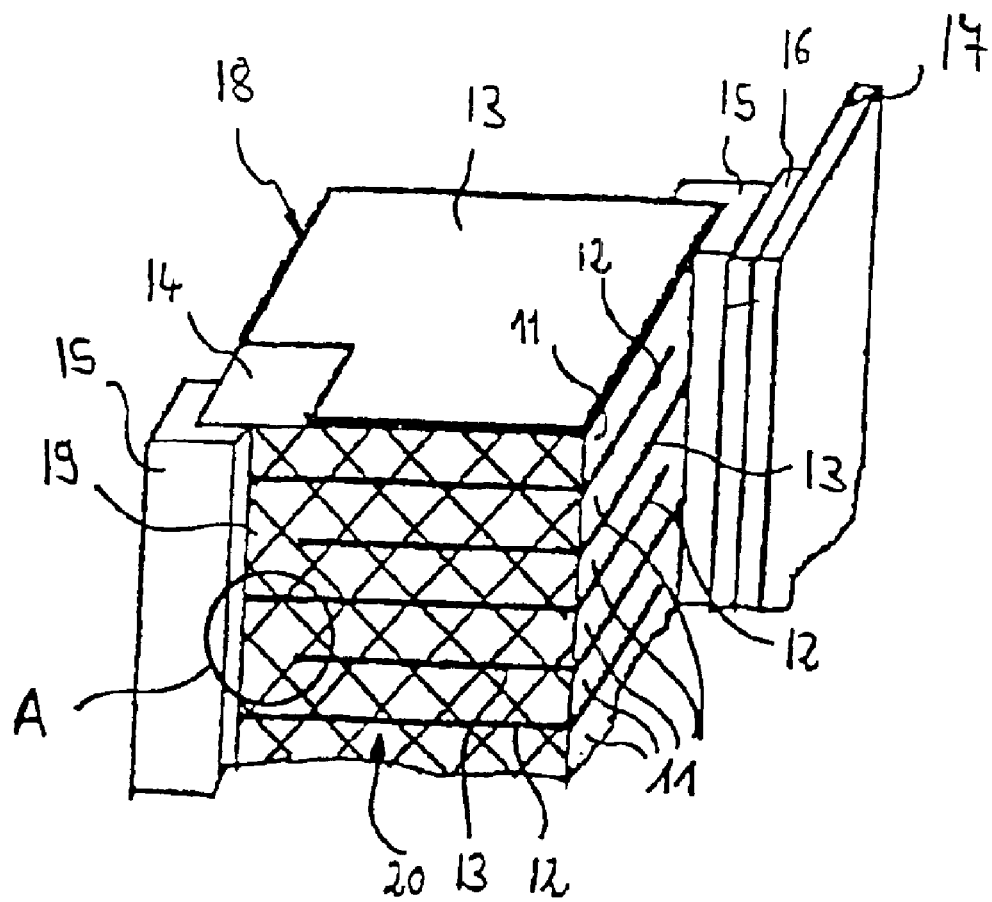
FIG. 1 shows a perspective view of a partial section of an inventive piezoelectric component in multilayer construction.
Figure 1:
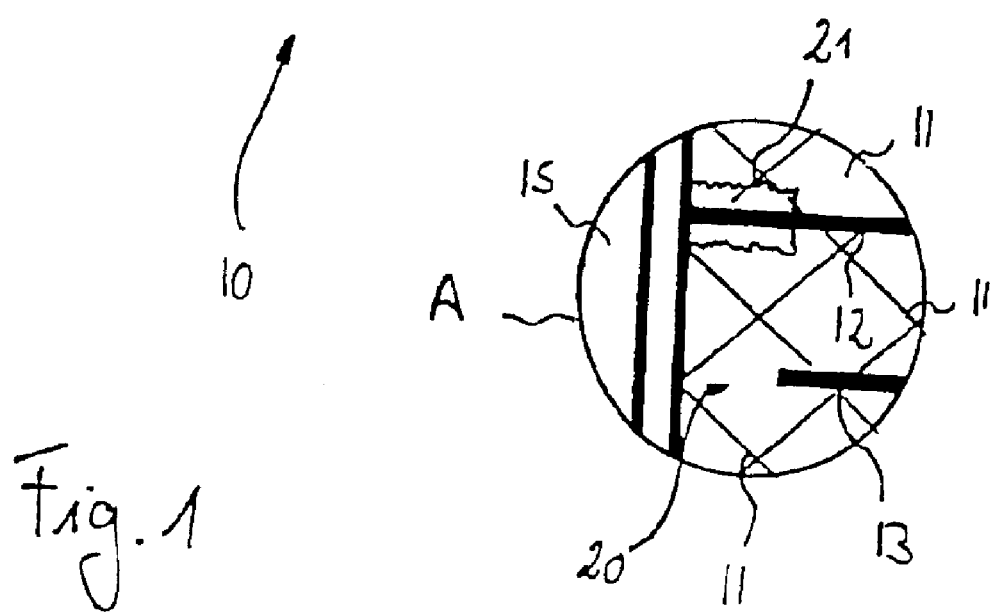

FIG. 1 depicts a piezoelectric component 10 in multilayer construction designed as a piezoelectric actuator. The piezoelectric actuator 10 comprises a stack 18 of a plurality of piezoelectric ceramic layers 11 and electrode layers 12, 13. The electrode layers 12 and 13 have different polarities, whereby electrode layers of the same polarity are designated as first electrode layers 12 and second electrode layers 13, respectively. Electrode layers 12 or 13 of the same polarity are connected to an external metallization 15, respectively.

Also present are inactive insulation areas 14, which are arranged alternately in opposite corners of the consecutive electrode layers 12, 13, which in this case do not extend across the entire stack cross section. This construction enables the common connection of all first electrode layers 12, or of all second electrode layers 13, with the same polarity by means of a common vertical external metallization 15. The external metallization 15 can be, for example, a corresponding metallization strip, which if necessary, is connected to other laterally protruding contact tabs 17 via a corresponding transition contact 16.

While in operation, the piezoelectric actuator 10 is subjected to enormous voltages. These voltages can lead to the appearance of cracks in the ceramic layers 11. Such polarity and operation-related mechanical damages to the piezoelectric actuator 10 begin primarily in the area of the inactive insulation areas 14. Here delamination cracks are created at the interface between the electrode layer and the ceramic on the electrode layers 12, 13 that extend up to the lateral surface 19 of the stack. Normally, there is no connection between two electrode layers 12, 13 of differing polarity in the case of a progressing crack. Accordingly, even in the presence of moisture and the like in the crack, no arcing or short circuits are created between the electrode layers 12, 13 of opposite polarity inside the piezoelectric actuator 10.

In order to achieve optimum deflection of the piezoelectric actuator 10 with minimum space requirements, the electrode layers 12, 13 must comprise the entire section of the piezoelectric actuator 10 up to the inactive insulation area 14. That means that the electrode layers 12, 13 of alternating polarities are exposed at the lateral surfaces 19 of the stack 18 of the piezoelectric actuator 10. For this reason, it is necessary to provide the lateral surfaces 19 of the stack 18, where the electrode layers 12, 13 are exposed, with a suitable passivation 20. FIG. 1 depicts such a passivation 20 on the lateral surface 19 in the form of cross-hatching.

For simplicity's sake, only one of the surfaces 19 is provided with a passivation 20. Of course, all of the surfaces 19 of the stack 18 can be provided with a passivation 20. In addition, it is also possible to provide the entire piezoelectric component 10, including the exterior metallization 15, transfer contacts 16, contact tabs 17 and the like with a sheath made of passivation material. For example, the entire component can be cast into a corresponding sheath made of passivation material.

Passivation 20 is a type of protective layer that avoids arcing and short circuits between adjacent electrode layers 12, 13 of different polarity. Such short circuits and arcing can, for example be caused by mechanical damage to the surface 19 of the stack 18, or through contamination with dirt, moisture, fuels and the like.

It is crucial for the reliability of the piezoelectric actuator 10 that the bond of the passivation 20, or a suitable passivation layer, which is applied to the surface 19 using silk screen printing, casting or the like, remains undisturbed on the surface of the ceramic layers 11 at all times. In the process, the passivation 20 must remain intact, particularly in areas where the delamination cracks occur in the ceramic material as already mentioned above. If the passivation 20 does not crack in the area of such a delamination crack of the ceramic, each deflection of the piezoelectric actuator 10, and therefore each time the cracked sides open, will produce substantial tensile and shearing stresses at the electrical component—passivation material interface surrounding the crack. This results in a successive separation of the passivation 20 in this area.

If, then, moisture or the like penetrates in between the crack produced on the surface 19 of the actuator and the passivation 20, the rapid failure of the piezoelectric actuator 10 can be anticipated due to an electrical short circuit along the surface 19 of the electrical component between two adjacent electrode layers 12, 13 of opposite polarity.

In order to avoid these disadvantages, the passivation material of the passivation 20 is designed to exhibit a crack resistance that is lower than the bonding strength of the passivation material on the piezoelectric actuator 10. This means that since the passivation 20 cracks before it separates, the disadvantageous separation of the passivation 20 from the surface 19 of the stack 18 as described above can no longer occur. This is explained with an enlarged section A marked with a circle in FIG. 1. The enlarged section A depicts an example of a crack 21 in the passivation 20, which, for example, extends perpendicular to the surface of the passivation 20. By means of such a crack 21, the tensile stress and shearing stress in the plane of the passivation 20 which are caused by the operating elongation of the piezoelectric actuator 10 sheathed by the passivation 22 are reduced to such a degree that the passivation 20 no longer separates from the surface 19 of the stack 18.

Advantageously, a suitable passivation material comprised of at least one polyurethane and/or at least one fluorine silicon rubber is used because these materials have both a very favorable degree of swelling, in particular in media such as water, diesel fuel, methyl ester of rape seed and the like. A piezoelectric actuator 10 passivated in this fashion can therefore be used advantageously in a diesel generator, whereby the piezoelectric actuator 10 can be saturated in the previously mentioned media without loss of seal.

What is claimed is:

1. A piezoelectric component having a multilayer structure, the piezoelectric component comprising:

piezoelectric ceramic layers;

electrode layers arranged among the piezoelectric ceramic layers in a stack such that the electrode layers and the piezoelectric ceramic layers alternate in the stack; and a passivation layer that is applied to a lateral surface of the stack via a coating process, the passivation layer comprising a passivation material having a crack resistance and a bonding strength, the crack resistance being lower than the bonding strength.

2. The piezoelectric component of claim 1, wherein the passivation material comprises at least one plastic.

3. The piezoelectric component of claim 1, wherein the passivation material comprises at least one material that exhibits low-viscosity properties during processing.

4. The piezoelectric component of claim 1, wherein the passivation material comprises at least one polyurethane.

5. The piezoelectric component of claim 1, wherein the passivation material comprises at least one fluorine-based material.

6. The piezoelectric component of claim 1, wherein the passivation material comprises at least one resin.

7. The piezoelectric component of claim 1, wherein the passivation material comprises at least one material from the latexes group.

8. The piezoelectric component of claim 1, wherein the passivation material comprises at least one of polyimides, polyamides, polymethylacrylates, and parylenes.

9. The piezoelectric component of claim 1, wherein the passivation material has a degree of expansion in liquid media of $\leq 40\%$.

10. The piezoelectric component of claim 1, wherein the passivation material has a permanent temperature stability of greater than 150° C.

11. The piezoelectric component of claim 1, wherein the passivation material is fixed to at least one lateral surface of the stack via an adhesive.

12. The piezoelectric component of claim 1, wherein the piezoelectric component comprises one of a piezoelectric actuator and a piezoelectric transducer.

13. The piezoelectric component of claims 1, wherein the piezoelectric component comprises a piezoelectric actuator in a diesel generator.

14. A piezoelectric actuator, comprising:

a stack comprised of piezoelectric layers and electrode layers, the electrode layers comprising electrode layers having a first polarity and electrode layers having a second polarity;

a passivation layer bonded to a surface of the stack, the passivation layer being applied via a coating process to coat the surface of the stack, the passivation layer comprising a passivation material having a crack resistance and a bonding strength, the crack resistance being lower than the bonding strength such that, when stress is applied to the piezoelectric actuator, the passivation layer cracks before the passivation layer separates from the stack; and an external metallization that is electrically connected to one of the electrode layers having the first polarity and the electrode layers having the second polarity.

15. The piezoelectric actuator of claim 14, wherein the passivation material comprises at least one of a plastic, a polyurethane, a fluorine-based material, and a resin.

16. The piezoelectric actuator of claim 14, wherein the passivation material comprises at least one material that exhibits low-viscosity properties during processing.

17. The piezoelectric actuator of claim 14, wherein the passivation material comprises at least one material from the latexes group.

18. The piezoelectric actuator of claim 14, wherein the passivation material comprises at least one of polyimides, polyamides, polymethylacrylates, and parylenes.

19. The piezoelectric actuator of claim 14, wherein the passivation material has a degree of expansion in liquid media of $\leq 40\%$ and/or the passivation material exhibits a permanent temperature stability of greater than 150° C.

20. The piezoelectric actuator of claim 14, wherein the external metallization comprises a strip, a transition contact, and an external contact, the strip contacting the one of the electrode layers, and the transition contact contacting both the strip and the external contact.

21. The piezoelectric component of claim 1, wherein the coating process comprises at least one of plasma deposition, cornona deposition, sputtering, and flame chemical vapor deposition.

22. A piezoelectric component comprising:

a stack of layers comprising:

piezoelectric ceramic layers; and electrode layers interspersed among the piezoelectric ceramic layers such that electrode layers and piezoelectric ceramic layers alternate in the stack of layers; and a plastic passivation material applied to a lateral surface of the stack via an adhesive;

wherein the plastic passivation material has a crack resistance and a bonding strength, the crack resistance being lower than the bonding strength.

23. The piezoelectric component of claim 1, wherein the stack has a top surface and a bottom surface, and wherein the lateral surface connects the top surface to the bottom surface.

24. The piezoelectric actuator of claim 14, wherein the stack has a top surface and a bottom surface, and wherein the surface to which the passivation layer is applied comprises a lateral surface that connects the top surface to the bottom surface.

25. The piezoelectric component of claim 22, wherein the stack has a top surface and a bottom surface, and wherein the lateral surface connects the top surface to the bottom surface.

* * * * *

UNITED STATES PATENT AND TRADEMARK OFFICE
CERTIFICATE OF CORRECTION

PATENT NO. : 6,930,438 B2  
APPLICATION NO. : 10/476209  
DATED : August 16, 2005  
INVENTOR(S) : Dieter Cramer et al.

It is certified that error appears in the above-identified patent and that said Letters Patent is hereby corrected as shown below:

On the title page after the heading of "Assignee:", add --Siemens AG, Munich (DE)--.

Signed and Sealed this
Twenty-eighth Day of August, 2012

David J. Kappos
*Director of the United States Patent and Trademark Office*